US012724051B2

(12) United States Patent
Tuominen

(10) Patent No.: US 12,724,051 B2
(45) Date of Patent: Sep. 1, 2026

(54) METHOD, A SYSTEM AND A COMPUTER PROGRAM PRODUCT FOR TESTING RADIO FREQUENCY TRANSPONDERS

(71) Applicant: Voyantic Oy, Helsinki (FI)

(72) Inventor: Jesse Tuominen, Helsinki (FI)

(73) Assignee: Voyantic Oy, Helsinki (FI)

( * ) Notice: Subject to any disclaimer, the term of this patent is extended or adjusted under 35 U.S.C. 154(b) by 151 days.

(21) Appl. No.: 18/720,737

(22) PCT Filed: Dec. 8, 2022

(86) PCT No.: PCT/FI2022/050818
§ 371 (c)(1),
(2) Date: Jun. 17, 2024

(87) PCT Pub. No.: WO2023/111393
PCT Pub. Date: Jun. 22, 2023

(65) Prior Publication Data

US 2025/0052796 A1 Feb. 13, 2025

(30) Foreign Application Priority Data

Dec. 16, 2021 (FI) .................................... 20216282

(51) Int. Cl.
*G01R 29/08* (2006.01)
*G06K 7/10* (2006.01)

(52) U.S. Cl.
CPC ..... *G01R 29/0871* (2013.01); *G06K 7/10366* (2013.01)

(58) Field of Classification Search
CPC .... G01R 29/00; G01R 29/08; G01R 29/0864; G01R 31/00; G01R 31/28; G01R 31/282; G01R 31/2822; G01R 29/0871; G01R 31/302; G06K 7/00; G06K 7/0008; G06K 7/10; G06K 7/10009; G06K 7/10118; G06K 7/10366; H04B 17/00; H04B 17/21
USPC .................................................. 324/600, 612
See application file for complete search history.

(56) References Cited

U.S. PATENT DOCUMENTS 7,257,504 B2 * 8/2007 Bolander ........... G06K 19/0726 438/18
2006/0226983 A1 10/2006 Forster et al.
2018/0121690 A1 5/2018 Forster et al.

FOREIGN PATENT DOCUMENTS

CN 101487875 B * 4/2011 ............. G01R 31/28

* cited by examiner

*Primary Examiner* — Hoai-An D. Nguyen
(74) *Attorney, Agent, or Firm* — Laine IP Oy

(57) ABSTRACT

The invention concerns a method a system and a computer program product for testing radio frequency transponders. The method comprises providing a plurality of transponders successively to a testing zone, detecting the responses of the transponders at the testing zone at one or more test points having a test frequency and a test power. According to the method, the test frequency and/or the test power of at least one of said test points is adapted for a RF transponder under the test on the basis of the detected responses of at least one previous tested RF transponder.

19 Claims, 3 Drawing Sheets

METHOD, A SYSTEM AND A COMPUTER PROGRAM PRODUCT FOR TESTING RADIO FREQUENCY TRANSPONDERS

FIELD OF THE INVENTION

The invention relates to radio frequency identification, RFID, technology. In particular, the invention relates to in-line testing of radio frequency identification transponders, RFID tags, on a production line.

BACKGROUND OF THE INVENTION

RFID transponders, or tags, are tested during production in order to detect and mark deficient ones. Deficiency can be detected by measuring their performance through frequency response in active state by using a test command and verifying a correct response from the tag. One typical performance parameter is tag sensitivity. There exists a performance test standard ISO 18046-3:2020, which is commonly used.

One problem relating to in-line testing is the very short time available for testing one tag, as the tags are typically produced using fast continuous production technologies. Typically, the time available for testing a tag may be of the order of 5-100 ms. This time slot is far too short for measuring the frequency response or other performance characteristics of a tag, at least completely enough. Typically, only one communication test with a single transmit frequency and transmit power level is utilized, which is not enough for allowing reasonable comparison with a reference measurement. Tag manufacturers commonly use commercially available RFID reading devices and modules, which cannot change the frequency or power fast enough to allow for utilization of more communication tests. Even if there were time for using one or few more communication tests at different frequencies and transmit power levels, the real frequency response level of the tag would remain fairly unknown.

A typical quality parameter on production lines is the acceptance rate of tags. If the acceptance rate is below an alert value, a production line is stopped.

Because the performance of tags includes natural dispersion, the transmit power at one or more communication test will need to be set high enough for only the weakest tags to be rejected. Consequently, the higher the dispersion tolerance, the blinder the screening process is for small but potentially systematic performance variations of the tags passing the production line. For example, if the performance of the tags is slowly decreasing during a long production run, the drift is detected only after production of a great amount of tags, which have performance characteristics well below the average.

Factors affecting the production quality include e.g. change of material types or batches used in production, adjustments and optimizations of the production process, and fault situations.

SUMMARY OF THE INVENTION

It is an aim of the present invention to solve at least part of the abovementioned problems and to provide an improved RFID testing system and method.

A particular aim of the invention is to provide a method and system for testing RFID transponders, which allows for smaller deviations in the production quality to be detected in the time available so that the production speed is not compromised.

A method and system may enable distinguishing between the monitoring of the production line, like quality of the production line, and the pass/rejection process of individual tags.

A method and system may enable the reduction of the duration of the time window used for testing and still maintaining or increasing the error sensitivity and quality of testing.

The aims of the invention are achieved by the system, the computer program product and the method as defined in the independent claims. Some advantageous embodiments are presented in the dependent claims.

Aspects of the invention are based on the idea of using one or more test points whose test frequency and/or power is adapted, i.e. non-constant, between tested tags. This enables obtaining additional information on the quality of the production process.

More specifically, according to an aspect, there is provided a method for testing radio frequency, RF, transponders, comprising providing a plurality of RF transponders successively to a testing zone, and detecting the responses of the RF transponders at the testing zone at one or more test points, which are configured to operate at a test frequency and/or test power. In the method the test frequency and/or test power of at least one of said test points is adapted for a RF transponder under the test on the basis of the detected responses of at least one previous tested RF transponder. The test points may be called adaptive test points. The whole test may be called an adaptive test. RF transponders may be called RF tags, RFID tags, tags or transponders.

According to an embodiment the responses of the transponders at the testing zone are detected at two or more test points, of which at least one is static and at least one is adaptive. According to an embodiment tag in production is tested with two sets of tests: the first static test set for the determination whether the tag under test has acceptable performance level, and the second, adaptable, test set for tracking the average performance of the production line.

According to an embodiment, the presented method is carried out on an RFID tag production line where multiple tags are being produced. The method is carried out using a tag testing device. Typically, tags are tested individually using test commands with selected test power levels and test frequencies. In response to the test commands, a valid response is expected from the tag. A first subset of the test commands at the first test point, typically with constant parameters, forms the criteria based on which a tag is accepted or rejected. The second subset of the test criteria, at the second test point, can be adaptable to track the mean of the previously tested tags according to a selected algorithm. This subset is used to monitor changes in the production quality.

According to an embodiment, the responses of the transponders at the testing zone are detected at at least two adaptive testing points.

According to an aspect, there is provided a system for testing a radio frequency, RF, transponders, comprising a testing zone and means for detecting responses of RF transponders provided successively to the testing zone at one or more test points, wherein the one or more test points are configured to operate at a test frequency and/or a test power. Said means for detecting the responses of the RF transponders are configured to adapt the test frequency and/or test power of at least one of said test points for a RF transponder under the test, on the basis of the detected responses of at least one previous tested RF transponder at the one or more test points.

According to one or more embodiments, the present system comprises at least one of:

- a production line where tags are being tested for their acceptance using a radio transmitter/receiver at the test points,
- one or more first test command set, with selected test parameters, for qualifying each tag as accepted or rejected,
- one or more second, adaptable, test command set, with adaptable test parameters, for tracking the mean performance of recently produced tags,
- an algorithm for the adaptation of the test points based on responses from previous tests at the corresponding test point; and/or at another adaptive test point.

Further, the system may comprise means for determining, based on the response of the tags to the second test command set, whether the production is to be continued as is, or to be readjusted with suitable readjusting means.

Aspects of the invention allow, by utilizing only two test commands at its simplest form, to separately both test the tags for acceptance and monitor the mean produced performance in real-time without compromising production speed. Thus, aspects of the invention allow distinguishing between detection of the quality of the production process from the pass/rejection process of individual tags, which is an improvement to existing systems. Aspects of the invention allow obtaining information on the quality of RFID transponder production during routine transponder testing without delaying the manufacturing process. In other words, adaptable testing according to embodiments can be carried out in the time window typically available for testing tags on commercial production lines without compromising the robustness of individual tag acceptance testing.

According to a third aspect, there is provided a computer program product for testing radio frequency, RF, transponders at a testing zone, where a plurality of RF transponders are provided successively, the computer program product comprising executable instructions, which when executed by a processor, cause the following:

- detecting responses of the RF transponders at the testing zone at one or more test points configured to operate at a test frequency and/or test power, and
- adapting the test frequency and/or test power at said the one or more test points for a RF transponder under the test, on the basis of the detected responses of at least one previous tested RF transponder at the one or more test points.

Next embodiments are discussed in more detail with reference to the attached drawings.

DETAILED DESCRIPTION OF EMBODIMENTS

In the context of this application terms a tag and a transponder have the same meaning and are used as synonyms with or without reference to radio frequency, RF, or to a radio frequency identification, RFID.

Figure 1:
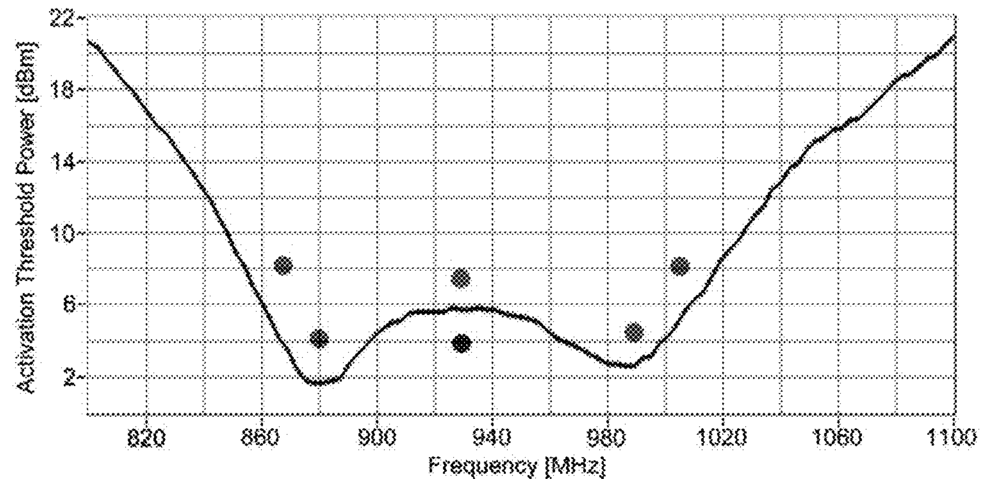
FIG. 1 shows, by way of an example, a graph on a transponder activation threshold power vs. frequency.

FIG. 1 illustrates a transponder activation threshold power in function of frequency. The graph includes six test points. At a test point a signal is sent to a transponder under the test. In case the power level of the test point signal is higher than the activation threshold power of the transponder, the transponder under the test is activated and sends a response, which is detected at the test point. This is illustrated in FIG. 1 by graph, which is under the illustrated test points in y-axis. In case the power level of the test point signal is lower than the activation threshold power of the transponder, the transponder under the test is not activated. This is illustrated in FIG. 1 as the one test point in the middle being below the activation threshold power graph in y-axis. Each test point is configured to operate at a certain frequency and at a certain power level.

As has become apparent from the above discussion, according to an embodiment of the invention, there is at least one static and at least one adaptive test point. A test point comprises a combination of frequency and power level, being a transmit frequency and a transmit power level. The test point comprises radio transmitter configured to transmit test commands, and a radio receiver configured to receive a response to the test command from a tag under test. The test command transmitted by the transmitter has a frequency and a power, which may be referred to as test parameters. In a test point, a test command is transmitted by a radio transmitter to a tag and a response is read from the tag by a radio receiver. A static test point is characterized in that its test parameters, being power level and frequency, are kept constant over the tests of plurality of tags. The static test point parameters may be kept constant typically over a single production run of several hundreds or thousands of tags. An adaptive test point is characterized in that at least one of its test parameters, including power level and frequency, is changed during the run based on the response or non-response observed for one or more previously tested tags. The static and adaptive test points form static and adaptive test point sets, respectively.

According to an embodiment, there are at least two adaptive test points. At least one of the test parameters, including frequency and power level, is changed during the run based on detected responses of at least one previous tag. The at least one previous tag may refer to the previous tag, to a number of previous tags, to a group of previous tags, and/or to selected tags. For example, response may be detected from each tag, from every second, third, or tenth tag, as selected or predetermined. According to embodiments, the detected response of a test point is used for adapting a mean value of the test point. A test power level and/or a test frequency, which is adapted to follow the mean value, may be adapted accordingly. In case of two adaptive test points, a second adaptive test point may be adapted to track a first adaptive test point. For example, a power level of the first adaptive test point may be changed based on the detected mean value. The second adaptive test point may be adapted accordingly, based on the detected mean value. The second adaptive test point may be at a power level tied with an offset to the first adaptive test point. The offset refers to a difference of the test frequency and/or test power between the test points. Adaptation is done by changing the current test frequency and/or test power level of the first and the second test points such that amount of change is the same for the first and the second test points. The same may be applied to more than two adaptive test points. The second adaptive test point may be used for individual tag testing.

A method according to an embodiment is preferably carried out in-line and the present system is placed in a manufacturing line of radio frequency identification transponders. Such manufacturing line can typically produce at least 2, or even ten, hundred or more tags per second.

Figure 2A:
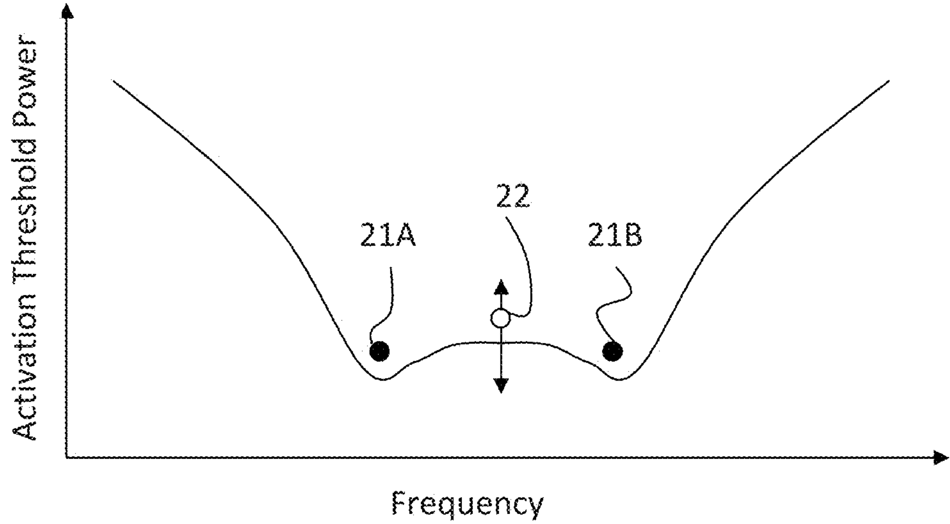
FIG. 2A shows, by way of an example, test points according to embodiments of the invention.

According to an embodiment of the invention, the test power of the at least one adaptive test point is adapted on the basis of at least one previous detected response. FIG. 2A illustrates this embodiment. There are two static test points 21A, 21B and one adaptive test point 22. In this embodiment, the transmit power of the adaptive test point 22 is variable, i.e. changed during the test run. The adaptive test point 22 may be variable based on previous tags tested, for example increased or decreased based on at least one previous response. The adaptive test point 22 may be increased, if the success rate of the previous tests is below a target value, and decreased, if the success rate of the previous tests is above a target value. The target value may be predefined. An exemplary transponder activation threshold power curve is drawn on the graph of FIG. 2A as a function of frequency. The transponder would pass the acceptance test since its activation threshold is lower than the test power of the static test points 21A, 21B at their frequencies (in this case at the notches of the curve). The adaptive test point can be used to find the mean activation threshold power of the tested transponders.

Figure 2B:
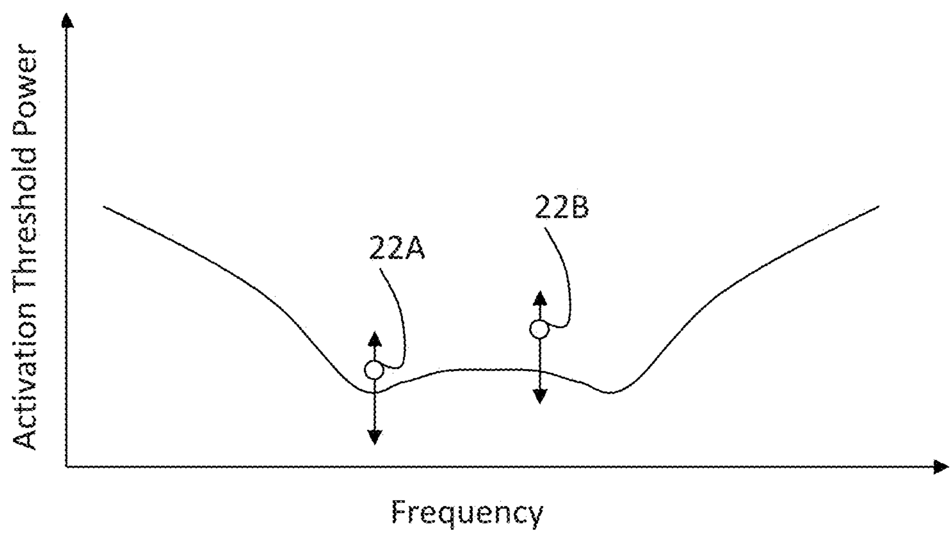
FIG. 2B shows, by way of an example, test points according to embodiments of the invention.

FIG. 2B shows an exemplary transponder activation threshold power curve. FIG. 2B shows two adaptive test points 22A and 22B. The first adaptive test point 22A is configured to operate at a variable transmit power. Transmit power level of the first adaptive test point 22A is dependent on responses from previous tested tags at the first adaptive test point 22A. The detected response of the first adaptive test point 22A is used for adapting a mean value of the first adaptive test point 22A. A transmit power level of the first adaptive test point 22A, which is adapted to follow the mean value, is adapted accordingly. The second adaptive test point 22B is adapted to track the first adaptive test point 22A. The second adaptive test 22B point is adapted based on the same detected mean value as the first adaptive test point 22A. The mean value is detected at the first adaptive point 22A. The second adaptive test point 22B is at a power level, which is different from the power level of the first adaptive test point 22A, at a constant offset from the power level of the first adaptive test point 22A. The adaptation of the second adaptive test point 22B is tracking the adaptation of the first adaptive test point 22A. The second adaptive test point 22B is used for individual tag testing. The second adaptive test point 22B accepts or rejects a tested tag.

Figure 3:
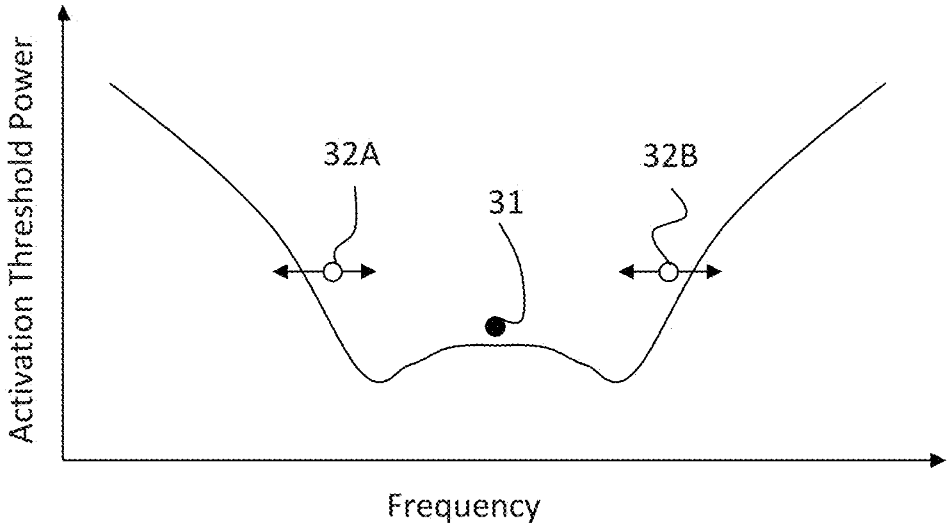
FIG. 3 shows, by way of an example, test points according to embodiments of the invention.

According to an embodiment, the test frequency at the at least one adaptive test point is adapted on the basis of responses of at least one previous tag. FIG. 3 illustrates this embodiment. There is one static test point 31 and two adaptive test points 32A, 32B. In this embodiment, the transmit frequencies at the adaptive test points 32A, 32B is variable, i.e. changed during the test run. The adaptive test points may be variable based on their success rate to track the average activation threshold of the previous tags. An exemplary transponder activation threshold power curve is drawn on the graph as a function of frequency. The exemplary transponder would pass the acceptance test, since its activation threshold is lower than that of the static test point 31 at its frequency. The adaptive test points can be used to find the mean frequency range of the response curve of the transponders.

Instead of one or two one-dimensionally adaptive test points, there may be three or more adaptive test points, which can be adapted in one or two dimensions, in any configuration. In an embodiment two-dimensionally adaptive test points can be used to track the activation threshold power of the transponders and the mean frequency range of the response curve of the transponders.

According to embodiments, at least one of a test frequency and a test power level is variable at the adaptive test point(s). In an embodiment at least one of the adaptive test points is configured to operate at a variable test frequency and at least one other of the adaptive test points is configured to operate at a variable test power.

The adaptation of the one or more adaptive test points is carried out, for example by an adaptation algorithm, which takes into account the detected responses of at least one previous tag, optionally at one adaptive test point. For example, if a non-response at an adaptive test point is observed for one tag, the power level of the adaptive test point can be increased for the next tag. As the iteration continues, the adaptive test point finds its location near the mean activation power of the tags produced at the particular production line.

According to an embodiment, the test power is increased and/or the test frequency is changed closer to an assumed center frequency of a transmitter of at least one adaptive test point, if a valid response is not obtained from a previous transponder.

According to an embodiment, the test power is decreased and/or the test frequency is changed farther from an assumed center frequency of a transmitter of at least one adaptive test point, if a valid response is obtained from a previous transponder.

If the adaptive test point power/frequency history is stored on storage means, it can be evaluated afterwards whether there were changes in the performance of the production line, e.g. at a specific instance, or if the performance remained essentially constant during the whole production run. Alternatively, or in addition to that, an alert may be provided if the trend of the produced tags change too much.

According to an embodiment, the method comprises adapting the at least one adaptive test point according to an adaptation algorithm based on the tests of one or more previous transponder, and if predefined criteria concerning the adaptation algorithm or at least adaptive test point are fulfilled, providing an alert. The alert may be e.g. audible or visual for the attention of the process controller or involve automatic stopping of the production.

Figure 4:
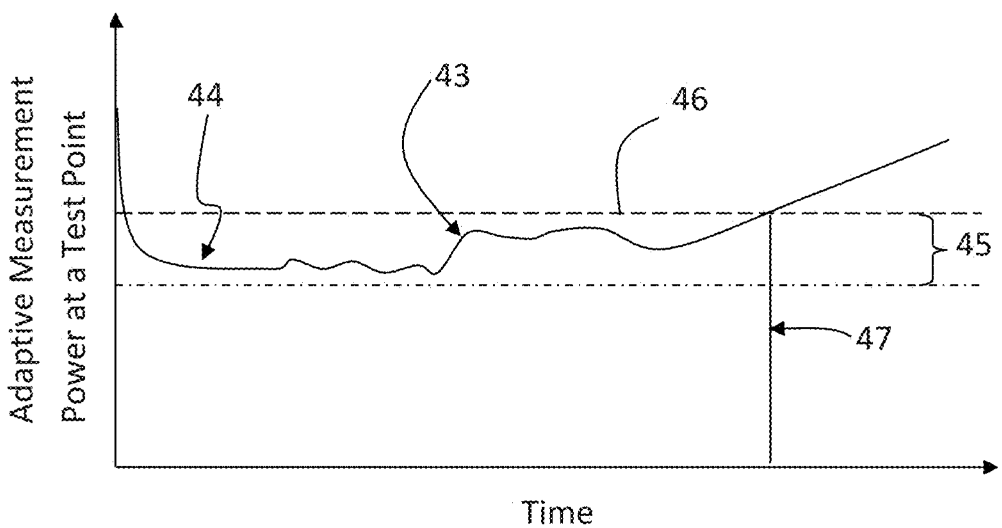
FIG. 4 shows, by way of an example, a trend line of a production run.

FIG. 4 illustrates an example trend line of a production run. The graph shows a trend line 44. The trend line 44 illustrates a transmit power value of an adaptive test point as a function of time during a test/production run. As can be seen, at first the transmit power value is high (so that each tag responds) but the adaptation algorithm rapidly brings the transmit or test power to an average threshold power range 45 of the tags, which may be predetermined. An alert power level 46, which may be higher than the average threshold power range 45 of the tags, is determined. At phase 43, a transmit power value is increased. The increased transmit power value indicates a potential detected step response in production quality at that moment in time. The trend line shows changes and variation inside the average threshold power range 45, not just deviations of the range 45. At point 47 of time, the transmit power level, which is adapted based on responses of tested tags, is observed to exceed the alert power level 46 determined. An alert is provided. An alert power level 46 may comprise upper and lower limit levels. According to an embodiment, an alert may be provided in case of a sudden and/or relatively big change, even the power level would still be at the average threshold power range 45.

Figure 5:
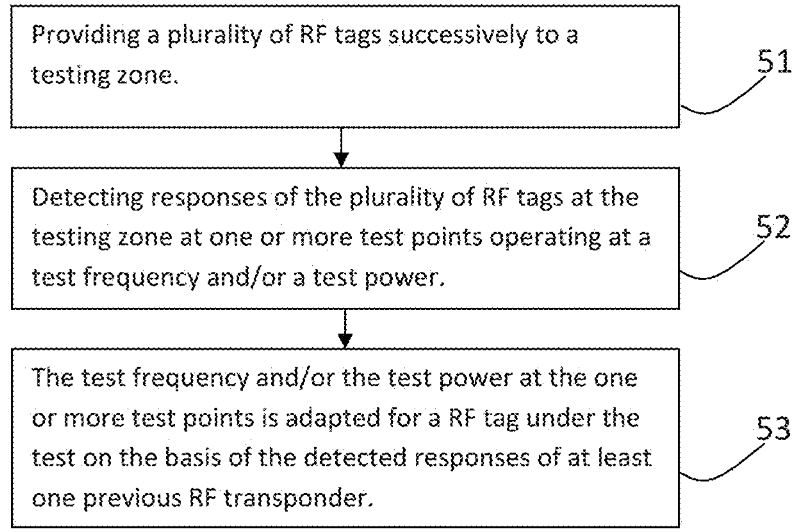
FIG. 5 shows, by way of an example, a method for testing RF transponders.

FIG. 5 illustrates a method according to embodiments. The method for testing RF tags comprises providing a plurality of RF tags successively to a testing zone 51, and detecting responses of the plurality of RF tags at the testing zone at one or more test points having a test frequency and/or a test power 52. The test frequency and/or the test power at one or more test points is adapted for an RF tag under the test, on the basis of the detected responses of at least one previous tested RF transponder 53. The detected responses of at least one previous tested RF transponder at the test point have effect on the adaptation of the test frequency and/or the test power level at the test point.

As has been discussed above, an individual transponder may be rejected based on a complete non-response, too low response power or otherwise invalid response of the transponder at least at one static or adaptive test point, as this is indicative of non-reliable performance of a tested tag. However, a low response power, an invalid response or complete non-response of a tag in an adaptive test point is arranged to cause adaptation of the test point, with or without rejection of a tag. An adaptive test point may be arranged to adapt a test power and/or a frequency based on the status of another adaptive test point. The response/non-response history can be stored on a storage device for further analysis.

According to an embodiment, the trend line may enable tracing or monitoring the test frequency, test power, the adaptation history and/or statistical characteristics of at least one adaptive test point. The trend line may enable tracing or monitoring the response power or non-response of the transponders at least at one adaptive or static test point. In a simple form, the test may comprise estimation of the mean response power of tags based on the final locations of one or more adaptive test points; or the response history of one or more adaptive test points; or the estimation of the shape or mean width of the response curve.

Testing RF transponders may be caused and/or controlled by executable instructions, which when executed by a processor, cause implementation of adapting the test frequency and/or test power of at least one of said test points is adapted for an RF transponder under the test on the basis of the detected responses of at least one previous tested RF transponder.

The previously presented aspects, embodiments, examples and ways of implementation are illustrated to show possible realizations, where obvious changes and modifications are possible. The invention is not limited to any specific example or illustration.

The invention claimed is:

1. A method for testing radio frequency, RF, transponders performed on a production line of RF transponders to monitor the production line, comprising:

providing a plurality of RF transponders successively to a testing zone, and detecting responses of the plurality of RF transponders at the testing zone at one or more test points configured to operate at a test frequency and a test power, wherein the test frequency and/or the test power at an adaptive test point is adapted for an RF transponder under the test on the basis of the detected responses of at least one previous tested RF transponder at the adaptive test point, such that:

the test power is increased and/or the test frequency is changed closer to an assumed center frequency for the RF transponder under the test, if a valid response is not obtained from the at least one previous RF transponder at the adaptive test point, and the test power is decreased and/or the test frequency is changed farther from the assumed center frequency for the RF transponder under the test, if the valid response is obtained from the at least one previous RF transponder at the adaptive test point.

2. The method according to claim 1, wherein the one or more test points comprise the adaptive test point and a static test point, wherein power level and/or frequency of the static test point are kept constant over the test of the plurality RF transponders.

3. The method according to claim 1, wherein the at least one previous RF transponder corresponds to at least one of: the previous RF transponder, a number of previous RF transponders, a group of previous RF transponders, and selected RF transponders.

4. The method according to claim 1, wherein the one or more test points comprise at least two adaptive test points, wherein:

at least one of the at least two adaptive test points configured to operate at a variable test frequency; and/or at least one of the at least two adaptive test points configured to operate at a variable test power.

5. The method according to claim 4, further comprising adapting at least one of the at least two adaptive test points based on validity of the response, the response power or non-response of the responses of the at least one previous RF transponder at one of the at least two adaptive test points.

6. The method according to claim 1, wherein the adaptive test point is configured to find the mean frequency of the tested RF transponders.

7. The method according to claim 1, wherein the adaptive test point is configured to find a mean activation threshold power of the tested RF transponders.

8. The method according to claim 4, wherein the at least two adaptive test points comprise a first and a second adaptive test point; and comprising adapting the second adaptive test point based on the detected responses at the first adaptive test point.

9. The method according to claim 8, wherein the first test point is configured to track the activation threshold power of the RF transponders and/or the mean frequency range of the response curve of the RF transponders at the first test point; and the second test point is configured to accept or reject the RF transponder under the test at the second test point.

10. The method according to claim 1, further comprising:

adapting at least one adaptive test point according to an adaptation algorithm based on the detected responses of the at least one previous RF transponders.

11. The method according to claim 1, further comprising:

detecting the responses of the RF transponders at the testing zone at two or more test points, wherein at least one of said two or more test points is static and the two or more test points preferably have different test frequencies and/or test powers.

12. The method according to claim 1, further comprising rejecting the RF transponder at the test point based on response power, non-response or invalid response of the RF transponder at the test point, wherein the test point is a static test point or an adaptive test point.

13. The method according to claim 1, wherein it is carried out in-line in a manufacturing line of radio frequency identification, RFID, transponders.

14. The method according to claim 13, further comprising monitoring the manufacturing line based on:

the test frequency and/or test power, or the adaptation history or statistical characteristics of at least one adaptive test point; and/or the response power, non-response or invalid response of the RF transponders at at least one adaptive test point.

15. The method according to claim 1, wherein the method is performed on a production line of RF transponders to monitor the RF transponders.

16. A system for testing a radio frequency, RF, transponders performed on a production line of RF transponders to monitor the production line, comprising:

a testing zone for receiving the RF transponders, and a block configured to detect responses of the RF transponders provided successively to the testing zone at one or more test points, wherein the one or more test points configured to operate at a test frequency and a test power, wherein said block configured to detect the responses of the RF transponders are configured to adapt the test frequency and/or the test power at an adaptive test point for an RF transponder under the test on the basis of the detected responses of at least one previous RF transponder at the adaptive test point, and wherein said block configured to detect responses of the RF transponders is further configured to:

increase the test power and/or change the test frequency closer to an assumed center frequency for the RF transponder under the test, if a valid response is not obtained from the at least one previous RF transponder at the adaptive test point, and decrease the test power and/or change the test frequency farther from the assumed center frequency of the RF transponder un the test, if the valid response is obtained from the at least one previous RF transponder at the adaptive test point.

17. The system according to claim 16, wherein the system comprises means for carrying out a method for testing radio frequency, RF, transponders, the method comprising:

providing a plurality of RF transponders successively to a testing zone, and detecting responses of the plurality of RF transponders at the testing zone at one or more test points configured to operate at a test frequency and a test power, wherein the test frequency and/or the test power at the one or more test points is adapted for an RF transponder under the test on the basis of the detected responses of at least one previous tested RF transponder at the one or more test points.

18. The system of claim 16, wherein the system is used on a production line of RF transponders to monitor the RF transponders and/or the production line.

19. A non-transitory computer readable medium for testing radio frequency, RF, transponders performed on a production line of RF transponders to monitor the production line at a testing zone, where a plurality of RF transponders are provided successively, the non-transitory computer readable medium comprising executable instructions, which when executed by a processor, cause the following:

detecting responses of the RF transponders at the testing zone at one or more test points configured to operate at a test frequency and a test power, and adapting the test frequency and/or the test power at an adaptive test points for an RF transponder under the test, on the basis of the detected responses of at least one previous RF transponder at the adaptive test point, such that:

the test power is increased and/or the test frequency is changed closer to an assumed center frequency for the RF transponder under the test, if a valid response is not obtained from the at least one previous RF transponder at the adaptive test point, and the test power is decreased and/or the test frequency is changed farther from the assumed center frequency for the RF transponder under the test, if the valid response is obtained from the at least one previous RF transponder at the adaptive test point.

* * * * *